(12) United States Patent
Beckers et al.

(10) Patent No.: US 10,495,984 B2
(45) Date of Patent: *Dec. 3, 2019

(54) LITHOGRAPHIC APPARATUS AND DEVICE MANUFACTURING METHOD

(71) Applicant: ASML NETHERLANDS B.V., Veldhoven (NL)

(72) Inventors: Marcel Beckers, Eindhoven (NL); Sjoerd Nicolaas Lambertus Donders, 's-Hertogenbosch (NL); Christiaan Alexander Hoogendam, Veldhoven (NL); Johannes Henricus Wilhelmus Jacobs, Eindhoven (NL); Nicolaas Ten Kate, Almkerk (NL); Nicolaas Rudolf Kemper, Eindhoven (NL); Ferdy Migchelbrink, Amersfoort (NL); Elmar Evers, Almelo (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 16/276,861

(22) Filed: Feb. 15, 2019

(65) Prior Publication Data

US 2019/0179232 A1 Jun. 13, 2019

Related U.S. Application Data

(63) Continuation of application No. 15/824,686, filed on Nov. 28, 2017, now Pat. No. 10,209,629, which is a
(Continued)

(51) Int. Cl.
*G03F 7/20* (2006.01)

(52) U.S. Cl.
CPC ...... *G03F 7/70716* (2013.01); *G03F 7/70341* (2013.01); *G03F 7/70808* (2013.01)

(58) Field of Classification Search
CPC ............ G03F 7/70341; G03F 7/70716; G03F 7/70808
(Continued)

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando Jan. 2001, Dec. 17, 2001.
(Continued)

*Primary Examiner* — Hung Nguyen
(74) *Attorney, Agent, or Firm* — Pillsbury Winthrop Shaw Pittman LLP

(57) ABSTRACT

A barrier member configured to at least partly confine a liquid in a space between a projection system and a substrate table of an immersion lithographic system, the barrier member including: a liquid inlet configured to provide liquid to the space, a liquid outlet configured to remove liquid from the space, the liquid outlet having a porous member located in a surface configured toward face the substrate, a first gas inlet configured to provide gas to the space, the first gas inlet arranged to face toward the substrate and the first gas inlet located outward, relative to a central portion of the barrier member, of the porous member, and a second gas inlet configured to provide gas to the space, the second gas inlet
(Continued)

arranged to face toward the substrate and the second gas inlet located outward, relative to the central portion, of the first gas inlet.

20 Claims, 5 Drawing Sheets

Related U.S. Application Data continuation of application No. 15/250,658, filed on Aug. 29, 2016, now Pat. No. 9,857,695, which is a continuation of application No. 14/664,360, filed on Mar. 20, 2015, now Pat. No. 9,429,853, which is a continuation of application No. 13/242,125, filed on Sep. 23, 2011, now Pat. No. 8,988,651, which is a continuation of application No. 13/240,908, filed on Sep. 22, 2011, now Pat. No. 8,976,334, which is a continuation of application No. 12/081,168, filed on Apr. 11, 2008, now Pat. No. 8,259,287, which is a continuation of application No. 11/098,615, filed on Apr. 5, 2005, now Pat. No. 7,411,654.

(58) Field of Classification Search
USPC .................................................. 355/30, 53
See application file for complete search history.

(56) References Cited

U.S. PATENT DOCUMENTS

| | | | |
|---|---|---|---|
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,121,256 A | 6/1992 | Corle et al. | |
| 5,610,683 A | 3/1997 | Takahashi | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,437,851 B2 | 8/2002 | Hagiwara | |
| 6,600,547 B2 | 7/2003 | Watson et al. | |
| 6,603,130 B1 | 8/2003 | Bisschops et al. | |
| 7,119,874 B2 * | 10/2006 | Cox | G03F 7/70341 355/30 |
| 7,411,654 B2 * | 8/2008 | Beckers | G03F 7/70341 355/53 |
| 7,701,550 B2 | 4/2010 | Kemper et al. | |
| 9,857,695 B2 | 1/2018 | Beckers et al. | |
| 2002/0020821 A1 | 2/2002 | Van Santen et al. | |
| 2002/0163629 A1 | 11/2002 | Switkes et al. | |
| 2003/0123040 A1 | 7/2003 | Almogy | |
| 2004/0000627 A1 | 1/2004 | Schuster | |
| 2004/0075895 A1 | 4/2004 | Lin | |
| 2004/0103950 A1 | 6/2004 | Iriguchi | |
| 2004/0114117 A1 | 6/2004 | Bleeker | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2004/0239954 A1 | 12/2004 | Bischoff | |
| 2004/0257544 A1 | 12/2004 | Vogel et al. | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0052632 A1 | 3/2005 | Miyajima | |
| 2005/0094116 A1 | 5/2005 | Flagello et al. | |
| 2005/0094125 A1 | 5/2005 | Arai | |
| 2005/0122505 A1 | 6/2005 | Miyajima | |
| 2005/0126282 A1 | 6/2005 | Maatuk | |
| 2005/0132914 A1 | 6/2005 | Mulkens et al. | |
| 2005/0134817 A1 | 6/2005 | Nakamura | |
| 2005/0140948 A1 | 6/2005 | Tokita | |
| 2005/0146693 A1 | 7/2005 | Ohsaki | |
| 2005/0146694 A1 | 7/2005 | Tokita | |
| 2005/0151942 A1 | 7/2005 | Kawashima | |
| 2005/0200815 A1 | 9/2005 | Akamatsu | |
| 2005/0213065 A1 | 9/2005 | Kitaoka | |
| 2005/0213066 A1 | 9/2005 | Sumiyoshi | |
| 2005/0219489 A1 | 10/2005 | Nei et al. | |
| 2005/0233081 A1 | 10/2005 | Tokita | |
| 2005/0263068 A1 | 12/2005 | Hoogendam et al. | |
| 2005/0286032 A1 | 12/2005 | Lof et al. | |
| 2006/0038968 A1 | 2/2006 | Kemper et al. | |
| 2006/0158627 A1 | 7/2006 | Kemper et al. | |
| 2006/0274293 A1 * | 12/2006 | Nagasaka | G03F 7/70341 355/53 |
| 2012/0008116 A1 | 1/2012 | Beckers et al. | |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 298 A2 | 5/2004 |
| EP | 1 420 300 A2 | 5/2004 |
| EP | 1 489 462 A1 | 12/2004 |
| EP | 1528433 | 5/2005 |
| EP | 1 420 298 A3 | 10/2005 |
| EP | 1 420 300 A3 | 10/2005 |
| EP | 1 598 855 A1 | 11/2005 |
| EP | 1 612 850 A1 | 1/2006 |
| EP | 1 667 211 A1 | 6/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002318232 | 10/2002 |
| JP | 2004-193252 | 7/2004 |
| JP | 2005-012228 | 1/2005 |
| JP | 2005-019864 | 1/2005 |
| JP | 2005-057278 | 3/2005 |
| JP | 2005-079238 | 3/2005 |
| WO | 99/49504 | 9/1999 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004/055803 | 7/2004 |
| WO | 2004/057589 | 7/2004 |
| WO | 2004/057590 | 7/2004 |
| WO | 2004/086468 | 10/2004 |

(56) References Cited

FOREIGN PATENT DOCUMENTS

| WO | 2004/090577 | 10/2004 |
| WO | 2004/090633 | 10/2004 |
| WO | 2004/090634 | 10/2004 |
| WO | 2004/090956 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2005/010611 | 2/2005 |
| WO | 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol, B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, J. Microlith., Microfab., Microsyst. 1(1):7-12 (2002).

Search Report for European Patent Application No. 06251863.4, dated Jul. 24, 2006.

European Search Report issued for European Patent Application No. 06251863.4-1226, dated Sep. 25, 2006.

Search Report for ROC (Taiwan) Patent Application No. 095112016 dated Mar. 25, 2009.

Chinese.Office Action for Chinese Application No. 200810092608.6 dated Sep. 4, 2009.

Japanese Office Action dated Jun. 4, 2013 in corresponding Japanese Patent Application No. 2009-292141.

U.S. Office Action dated Jul. 15, 2014 in corresponding U.S. Appl. No. 13/240,908.

\* cited by examiner

Fig. 2
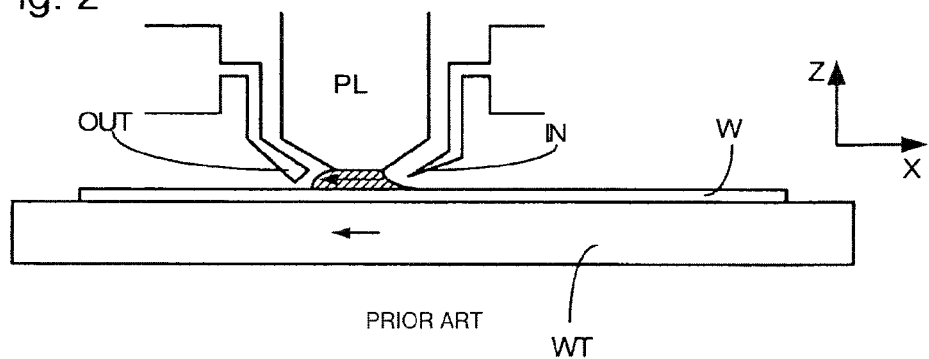
PRIOR ART
Fig. 3
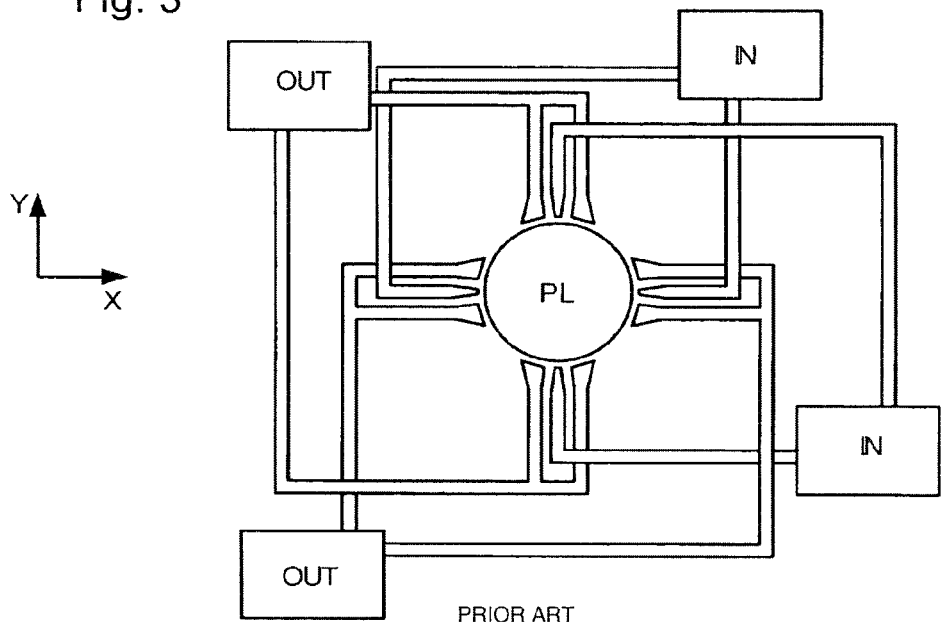
PRIOR ART
Fig. 4
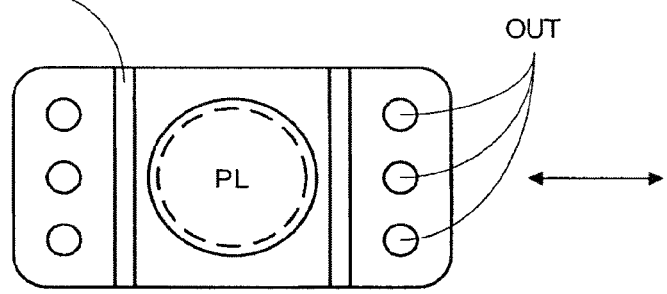
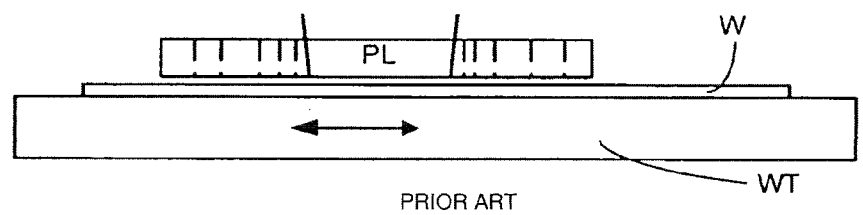
PRIOR ART

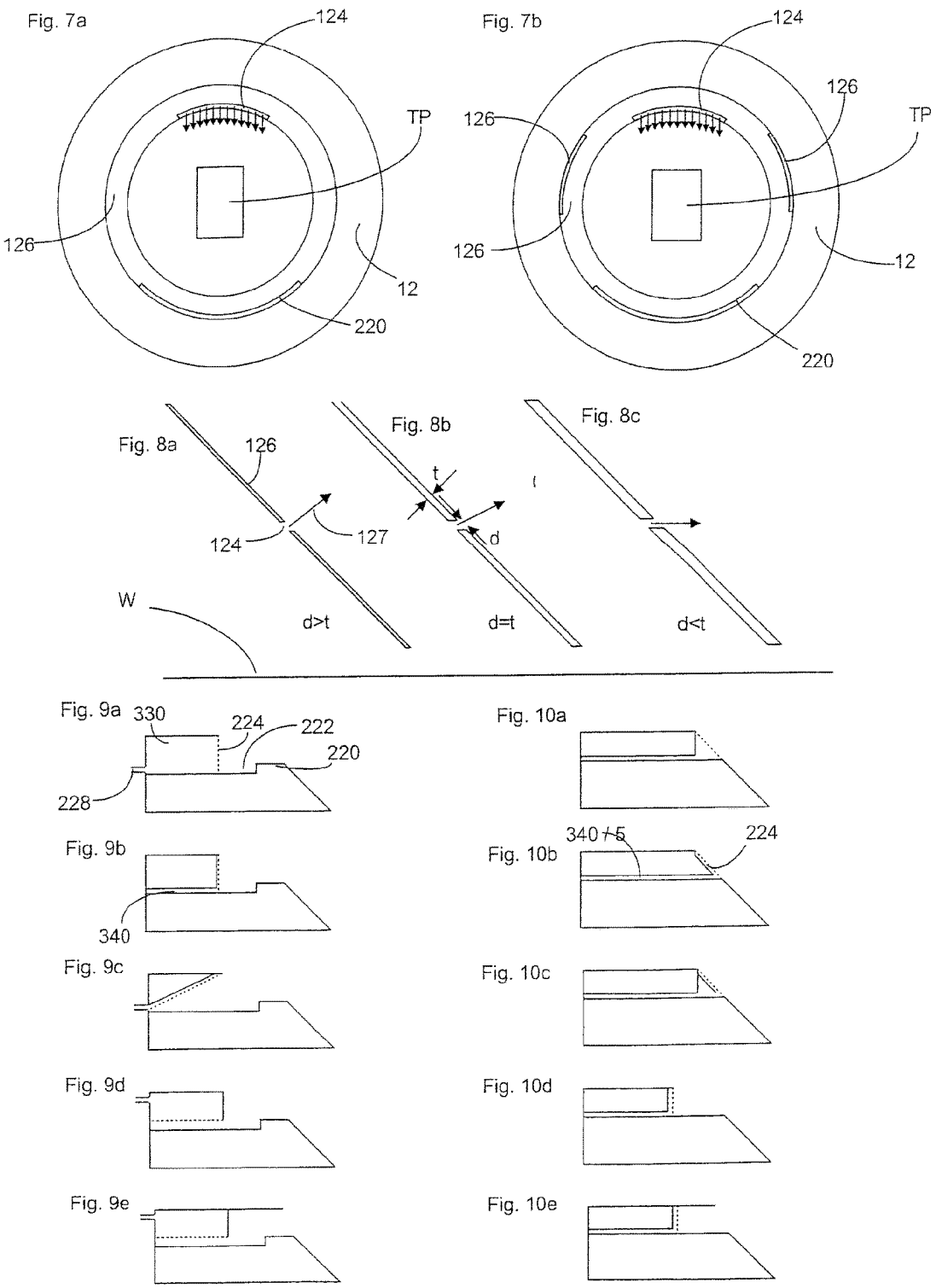

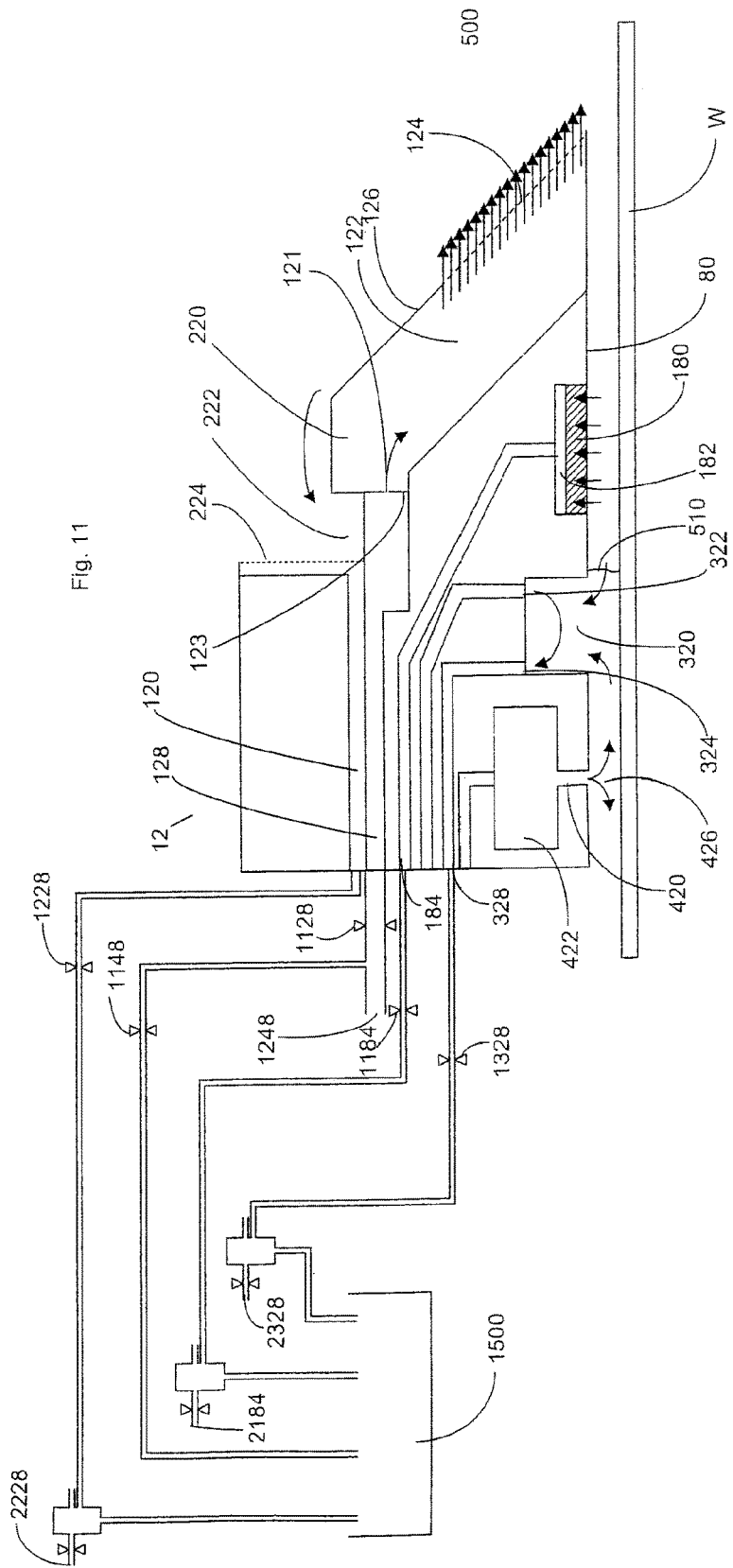

LITHOGRAPHIC APPARATUS AND DEVICE MANUFACTURING METHOD

This application is a continuation of U.S. patent application Ser. No. 15/824,686, filed Nov. 28, 2017, now allowed, which is a continuation of U.S. patent application Ser. No. 15/250,658, filed Aug. 29, 2016, now U.S. Pat. No. 9,857,695, which is a continuation of U.S. patent application Ser. No. 14/664,360, filed Mar. 20, 2015, now U.S. Pat. No. 9,429,853, which is a continuation of U.S. patent application Ser. No. 13/242,125, filed Sep. 23, 2011, now U.S. Pat. No. 8,988,651, which is a continuation of U.S. patent application Ser. No. 13/240,908, filed Sep. 22, 2011, now U.S. Pat. No. 8,976,334, which is a continuation of U.S. patent application Ser. No. 12/081,168, filed Apr. 11, 2008, now U.S. Pat. No. 8,259,287, which is a continuation of U.S. patent application Ser. No. 11/098,615, filed Apr. 5, 2005, now U.S. Pat. No. 7,411,654, each of the foregoing applications is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, desirably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Desirably the seal is a contactless seal such as a gas seal. Such a system with a gas seal is illustrated in FIG. 5 and disclosed in EP-A-1 420 298 hereby incorporated in its entirety by reference.

In EP-A-1 420 300 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

The seal member disclosed in EP-A-1 420 298 has several problems. Although the system can provide immersion liquid between the final element of the projection system and the substrate, the immersion liquid can sometimes overflow and sometimes recirculation of immersion liquid in the space between the final element of the projection system and the substrate occurs which can result in imaging errors when the radiation beam is projected through the recirculation areas thereby heating immersion liquid up and changing its refractive index. Furthermore, overflow of the seal member is hard to avoid in certain circumstances.

SUMMARY

It is desirable to provide a seal member or barrier member which overcomes some of the above mentioned problems. It is an aspect of the present invention to provide a seal member or barrier member in which turbulent flow is reduced and in which overflowing of the immersion liquid is reduced.

According to an aspect of the present invention, there is provided a lithographic apparatus including a substrate table constructed to hold a substrate; a projection system configured to project a patterned radiation beam onto a target portion of the substrate, and a barrier member having a surface surrounding a space between a final element of the projection system and the substrate table configured to contain a liquid in the space between the final element and the substrate; the barrier member including a liquid inlet configured to provide liquid to the space and a liquid outlet configured to remove liquid from the space; wherein the liquid inlet and/or liquid outlet extend(s) around a fraction of the inner circumference of the surface.

According to another aspect of the present invention, there is provided a lithographic apparatus including a substrate table constructed to hold a substrate; a projection system configured to project a patterned radiation beam onto a target portion of the substrate, and a barrier member having a surface surrounding a space between a final element of the projection system and the substrate table configured to contain a liquid in the space between the final element and the substrate; the barrier member including a liquid inlet configured to provide liquid to the space, the inlet including a chamber in the barrier member separated from the space by a plate member, the plate member forming at least part of the surface and having a plurality of through holes extending between the chamber and the space for the flow of liquid therethrough.

According to another aspect of the present invention, there is provided a lithographic apparatus including a substrate table constructed to hold a substrate; a projection system configured to project a patterned radiation beam onto a target portion of the substrate; a liquid supply system configured to supply liquid to a space between a final element of the projection system and a substrate; and a control system configured to dynamically vary the rate of extraction of liquid by the liquid supply system from the space and/or dynamically vary the rate of supply of liquid by the liquid supply system such that a level of liquid in the space is maintained between a predetermined minimum and a predetermined maximum.

According to another aspect of the present invention, there is provided a lithographic apparatus including a substrate table constructed to hold a substrate; a projection system configured to project a patterned radiation beam onto a target portion of the substrate; and a liquid supply system configured to provide liquid to a space between a final element of the projection system and a substrate; wherein the liquid supply system includes an extractor configured to remove liquid from the space, the extractor including a two dimensional array of orifices through which the liquid can be extracted from the space.

According to another aspect of the present invention, there is provided a device manufacturing method including projecting a patterned beam of radiation onto a substrate using a projection system, wherein a barrier member has a surface which surrounds the space between a final element of the projection system which projects the patterned beam and the substrate thereby containing a liquid in a space between the final element and the substrate; providing liquid to the space through a liquid inlet; and removing liquid from the space via a liquid outlet, wherein the liquid inlet and/or liquid outlet extend(s) around a fraction of the inner circumference of the surface.

According to another aspect of the present invention, there is provided a device manufacturing method including projecting a patterned beam of radiation onto a substrate using a projection system, wherein a liquid is provided between a final element of the projection system and the substrate, the liquid being contained by a barrier member having a surface, the liquid being provided to the space through an inlet which includes a chamber in the barrier member separated from the space by a plate member and the plate member having a plurality of through holes extending between the chamber and the space through which the liquid flows.

According to another aspect of the present invention, there is provided a device manufacturing method including projecting a patterned beam of radiation onto a substrate using a projection system, wherein liquid is provided to a space between the final element of a projection system and the substrate and the rate of extraction of liquid from the space is dynamically varied and/or the rate of supply of liquid to the space is dynamically varied to maintain the level of liquid in the space between a predetermined minimum and a predetermined maximum.

According to another aspect of the present invention, there is provided a device manufacturing method including projecting a patterned beam of radiation onto a substrate using a projection system, wherein liquid is provided to a space between a final element of a projection system and a substrate; liquid being extracted from the space through an extractor which includes a two dimensional array of orifices.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIGS. 2 and 3 depict a liquid supply system used in a prior art lithographic projection apparatus;

FIG. 4 depicts a liquid supply system according to another prior art lithographic projection apparatus;

FIGS. 7*a* and *b* depict, in plan, a seal member of the present invention;

FIGS. 8*a-c* depict variations in flow direction through the seal member with hole diameter to plate thickness ratio of immersion liquid;

FIGS. 9*a-e* illustrate different embodiments of overflows according to the present invention;

FIGS. 10*a-e* depict different embodiments for liquid extraction according to the present invention; and FIG. 11 depicts the control system for the management of immersion liquid in the seal member according to the present invention.

DETAILED DESCRIPTION

Figure 1:
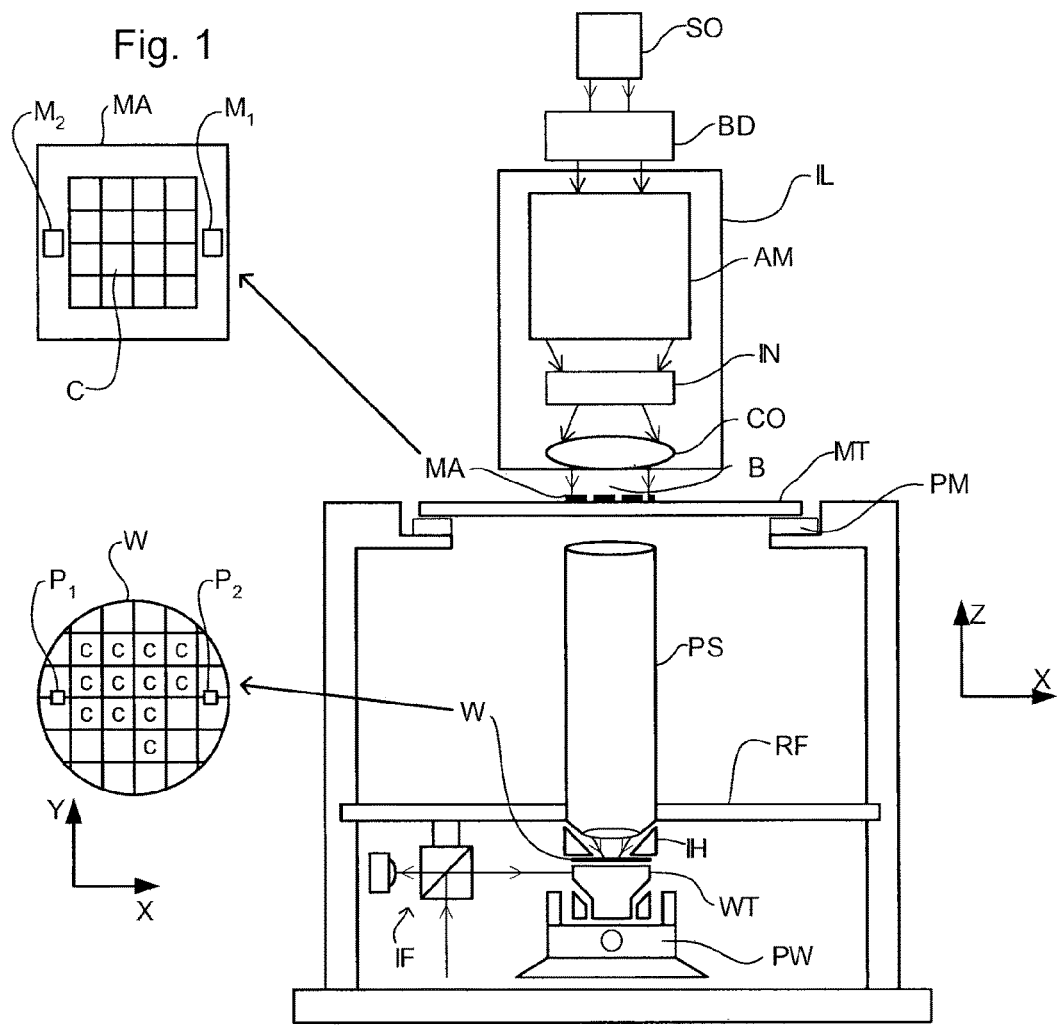
FIG. 1 depicts a lithographic apparatus according to an embodiment of the present invention.
Figure 5:
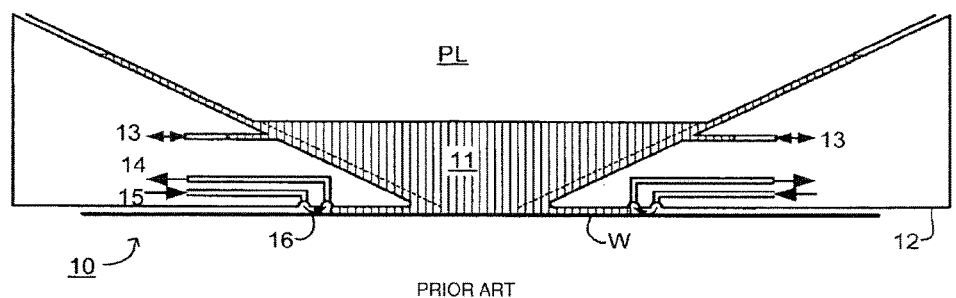
FIG. 5 depicts a seal member as disclosed in European Application No. 03252955.4.

FIG. 1 schematically depicts a lithographic apparatus according to an embodiment of the present invention. The apparatus includes an illumination system (illuminator) IL configured to condition a radiation beam B (e.g. UV radiation or DUV radiation). A support (e.g. a mask table) MT is constructed to support a patterning device (e.g. a mask) MA and is connected to a first positioning device PM configured to accurately position the patterning device in accordance with certain parameters. A substrate table (e.g. a wafer table) WT is constructed to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W. A reference frame RF is configured to support the projection system PS.

The illumination system may include various types of optical components, such as refractive, reflective, magnetic, electromagnetic, electrostatic or other types of optical components, or any combination thereof, for directing, shaping, or controlling radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 6:
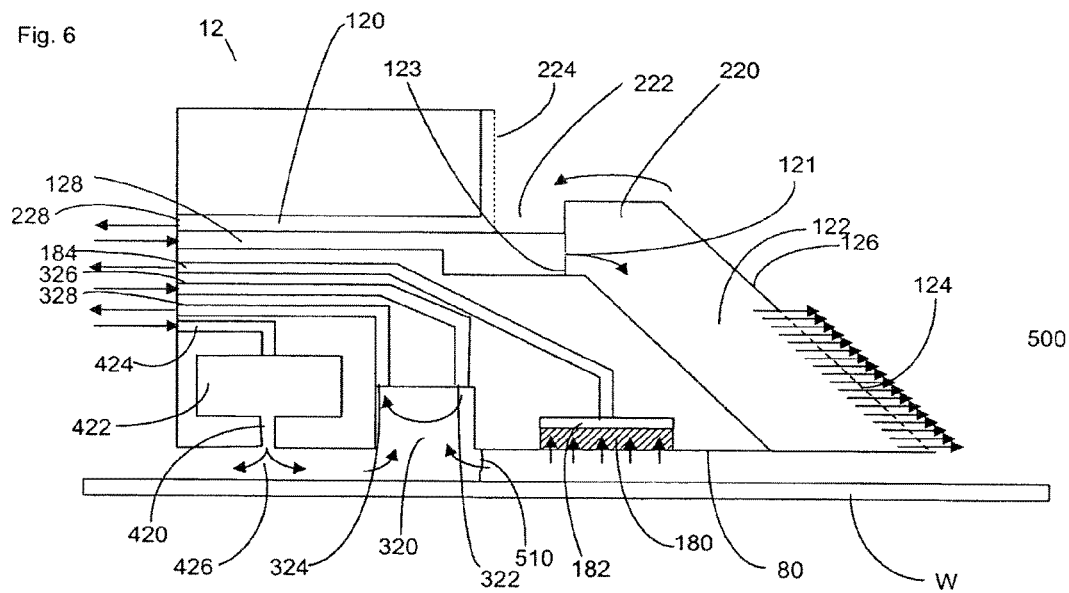
FIG. 6 depicts schematically, in cross-section, a seal member of the present invention.

FIG. 6 illustrates the seal member or barrier member 12 of the present invention. Working radially outwardly from the optical axis of the projection system, there is provided a plurality of inlets 124 through which immersion liquid 500 is provided to the space 11 between the projection system PS and the substrate W. On the bottom surface 80 of the seal member 12 there is then provided a liquid removal device 180 such as the one disclosed in U.S. Patent Application Publication No. 2006/0038968, hereby incorporated in its entirety by reference. Radially outwardly of the liquid removal device 180 is provided a recess 320 which is connected through inlet 322 to the atmosphere and via outlet 324 to a low pressure source. Radially outwardly of recess 320 is a gas knife 420. The arrangement of these three items on the bottom surface 80 of the seal member 12 is described in detail in U.S. Application 60/643,626 filed Jan. 14, 2005 hereby incorporated in its entirety by reference. At the top inner surface of the seal member 12 is a vertically extending protrusion or dike 220 over which immersion liquid 500 can flow into overflow area 222 and which can then be extracted through hole array 224 via a low pressure source attached to port 228.

FIG. 6 is a schematic cross-section of the seal member 12. Each of the five elements described above are not necessarily present around the entire circumference of the seal member. This is particularly the case with the immersion liquid inlets 124 and the liquid outlet or extractor (i.e. the dike 220/hole array 224). As can be seen in FIG. 7a, these can be advantageously provided only around a localized inner circumference of the seal member 12 and desirably opposite each other. As can be seen from figures, the liquid inlets 124 and liquid outlet are at different distances from the substrate W. Suitable fractions of length of liquid inlets 124 and/or liquid outlet is less than ½, desirably less than ⅓ of the inner circumference of the seal member 12. Desirably the length of the liquid inlets 124 and/or liquid outlet is more than 1/20, more desirably more than 1/15 or 1/10 of the inner circumference of the seal member 12. This helps in creating a laminar non-turbulent flow of immersion liquid from the outlets 124, across the space 11 (i.e. a cross-flow) between the projection system PS and the substrate through the target portion TP through which the radiation beam images the substrate, and out of the space through hole array 224. It is also possible to encourage flow of the immersion liquid across the space 11 by providing the liquid extraction unit 180 on the opposite side of the seal member 12 to the inlet ports 124 but this is not necessarily the case. Alternatively, the extraction unit 180 can be positioned around the entire circumference, perhaps with a larger extraction pressure applied to it opposite the inlets 124. FIG. 7b illustrates another embodiment in which three liquid outlets or extractors 224 are provided around the inner circumference of the barrier member 12. The three outlets are positioned at roughly 120° apart, with the biggest outlet being opposite to the liquid inlets 124 and the other two outlets being smaller and positioned on either side of the inlets 124.

The way in which the liquid is provided to the liquid inlets 124 and the design of the liquid inlets 124 themselves will now be described in detail with reference to FIGS. 6 and 8. As can be seen in FIG. 6, immersion liquid is provided through inlet 128 into the seal member 12. A first pressure drop is created in the immersion liquid by forcing it through an orifice 121 which puts a first chamber 120 into liquid communication with a second chamber 122. In reality orifice 121 is a plurality of individual holes created in plate 123, separating the chambers 120 and 122. The plurality of holes 121 are arranged in a regular one-dimensional array in the illustrated embodiment, but other arrangements such as two or more parallel rows of holes 121 one above another can also be used. The holes 121 distribute the flow over plate 126, which separates chamber 122 from the space 11, in the tangential direction and ensure a homogeneous flow over the whole width of the array of orifices 124 irrespective of the configuration of the supply 128. Once the immersion liquid has entered the second chamber 122, it enters through orifices 124 into the space 11 between the projection system PS and the substrate W. The orifices 124 are provided in a (regular) two-dimensional array in the plate 126 of the seal member 12. This creates a parallel, homogeneous flow inside the space 11. The array of orifices 124 is positioned towards the lower surface 80 of the plate 126, desirably below the level of the projection system PS when the seal member 12 is in use.

The present inventors have found that the ratio of orifice 124 diameter d to outer plate 126 thickness t may be considered in controlling the direction in which the immersion liquid leaves the chamber 122. This is even the case if all of the orifices 124 are drilled through the plate 126 in a plane which will be parallel to the substrate W in use.

As can be seen from FIG. 8a, if the diameter d of the orifice 124 is greater than the thickness t of the outer plate 126, the flow of immersion liquid can exit at an angle illustrated by arrow 127 i.e. non parallel to the substrate W surface. In FIG. 8b, the wall thickness t is equal to the diameter d of the orifice 124 and in FIG. 8c, the diameter d of the orifice 124 is less than the thickness t of the outer wall 126. It has been found that the orifice diameter should be less than the thickness of the plate 126. Typically the plate thickness will be of the region of 0.4 mm and the diameter of the orifice 124 is in the region of 0.15 mm for flow to exit parallel to the substrate surface and parallel to the direction in which the orifice is machined in the plate 126 (the plate 126 is not necessarily vertically orientated and can be inclined as illustrated). The dimensions are a trade off between having small enough orifices 124 to create a large enough pressure drop and having a plate thickness thick enough to give the desired stiffness. As a result, a much more laminar flow with a lower velocity and less mixing is produced than with prior art designs. The parallel flow is encouraged by making the small orifice in a relatively thick plate. The desired ratio of plate thickness t to orifice diameter d is at least 1:2.5 so that the flow can be directed in the same direction as the axis of the orifice. The orifices are machined (drilled) substantially parallel to each other and substantially parallel to the plane of the substrate W and substantially perpendicular to the surface of the plate 126 through which they extend. The orifices can be cut by laser as small as 20 µm and as large as desired. Another way of manufacturing small holes in a plate is by electroforming (electrolytical deposition) of, for example, nickel. Holes with a diameter of 5 to 500 µm in a sheet of thickness between 10 µm and 1 mm are possible using this technique. This technique can be used to produce both inlets and outlets as described elsewhere in this description. However, unlike with the other manufacturing methods, it is difficult to align accurately the axis of the through hole using this method.

It has been found that the number of orifices and the angle their axis makes with the outer plate 126 as well as their diameter has an effect on the direction in which the liquid flows. Generally, with a single hole, flow is directed slightly away from the axis of the hole towards the side of the plate with which the axis of the hole makes an acute angle, i.e. in FIG. 8, if the axis of the hole is parallel to the substrate W, slightly downwards from horizontal towards the substrate. The more holes that are present, the more pronounced the effect. This effect can be used to redirect flows of any fluid types in many applications (e.g. airshowers, purge hoods) and thereby eliminate or reduce the need for vanes or deflection plates or use of the Coanda effect. The effect is so strong that it can act against the force of gravity. It is thought that the origin of the effect is the interaction of a large number of asymmetrical fluid jets. The flow deflection also occurs when the fluid flows into a large volume of the same fluid, so the flow deflection is not related to the teapot leakage problem where tea leaks along the spout of the teapot. If the outer wall 126 is vertical, the axis of the orifices 124 should be parallel to the substrate W upper surface. If the outer wall 126 is included, as illustrated, in order to achieve flow parallel to the substrate surface, it has been found that the axis of the orifices 124 should be inclined away from the top surface of the substrate by about 20 degrees, desirably in the range of from 5 to 40 degrees.

The two-step pressure drop (there is a pressure drop as described, when the liquid goes through orifices 121 and clearly there will also be a pressure drop when the liquid passes through orifices 124) is arranged to be over the whole of the width of the supply and height of the supply. In this way the first pressure drop ensures that the flow is provided evenly over the orifices 124 irrespective of the supply channel configuration (i.e. the channel between input 128 and chamber 120), as described.

The laminar flow is desirable because it prevents recirculation of immersion liquid which can result in those recirculated areas of liquid becoming hotter or colder than the remaining liquid and therefore having a different refractive index or resulting in certain areas of the resist being more dissolved by the immersion liquid than others (i.e. a non-uniform concentration of resist in the immersion liquid which can change the refractive index of the immersion liquid) and also preventing transport of the resist to the projection lens.

Desirably the density of holes in the plate 126 is of the order of 15 holes per square mm. A range of from 1 to 30 holes per square mm is desirable.

In prior art seal members, liquid has been extracted either from the bottom surface 80 of the seal member 12 or from a single outlet positioned in the inner wall of the seal member 12 defining the space 11. The outlet has either been a one dimensional array of holes around the entire circumference of the inner surface of the seal member 12 or has been an annular groove around the circumference. A problem with this type of liquid extraction is that the holes in the inner wall of the seal member are either extracting or are not extracting and the transition between extraction and non extraction can result in undesirable vibrations of the seal member 12. One solution which has been proposed is disclosed in European Patent Application No. 04256585.3, hereby incorporated in its entirety by reference. In that document, a dike 220 is provided similar to the one illustrated in FIG. 6. Here, if the level of immersion liquid 500 in the space rises above the level of the dike, it overflows the dike into a pool or overflow 220 behind the dike and with a lower level than the dike. The immersion liquid may then be removed from the overflow 222. Again a difficulty with this system is that extraction either tends to happen or does not happen and there is a difficulty with the control of the amount of extraction resulting in occasional overflow.

In the present invention, a two dimensional array of holes or mesh 224 is provided in a wall of the seal member 12 through which liquid is extracted. Immersion liquid which either overflows a dike 220 or flows above the level of the lower most hole of the 2d array 224 is extracted by extractor 228. Desirably a non-homogenous array of holes in the wall of the seal member is used in which the number of holes per unit area and/or size of holes increases from a minimum furthest away from the substrate to a maximum nearest the substrate or at lowest position. Thus there is a smaller resistance for the immersion liquid to pass through the array at the lowest level and a higher resistance for air at the upper level of the plate. Thus by using a vertical gradient in the hole distribution (either in size or density or both) the resistance of the plate to flow is increased with increasing vertical height. Thus the problem of the flow of air out through the holes pushing away water and thereby making level control difficult is addressed. Such embodiments are illustrated in FIGS. 9a-e. In an alternative embodiment illustrated in FIGS. 10a-e no dike is present and the immersion liquid is removed as soon as its level reaches above the lower most hole of array 224. As is illustrated in FIGS. 7a and b, the extraction arrangements illustrated in FIGS. 9a-e and 10a-e may be provided only around a fraction of the inner circumference of the seal member 12, desirably opposite the inlets 124. However, clearly the outlets illustrated in FIGS. 9a-e and 10a-e can be provided the whole way around the inner circumference of the seal member 12. It is possible to provide a different level of under pressure to the outlet 228 around the circumference of the seal member in the latter embodiment thereby arranging for different extraction rates around the inner circumference of the seal member 12. Arranging for different extractions rates either by varying the pressure of an extractor extending around the entire circumference of the seal member 12 or by arranging for only a localized extractor can help in promoting laminar flow of immersion liquid from the inlets 124 across the target portion TP and out through the extractor.

The array of holes 224 may include holes of the order of between 0.1 and 0.5 mm in diameter. A density of 0.25 to 5 holes per square mm is desirable. The use of the two dimensional array of holes has the benefit that the immersion liquid 11 is more easily controlled because a higher immersion liquid level wets more holes of the array 224 resulting in a higher extraction rate. Conversely, a lower level of immersion liquid will wet fewer holes and thereby result in a lower extraction rate. In this way the extraction of immersion liquid is automatically regulated without the need for adjusting the extraction rate at outlet 228. This is particularly the case when the hole array 224 is vertically or at least partly vertically orientated. The use of a dike 220 allows the array of holes 224 to extend to a lower level than the dike increasing the extraction capacity. If the barrier member 12 is made liquid philic (hydrophilic in the case that the immersion liquid is water) build up of liquid level due to surface tension effects can be minimized.

The overflow 220 allows sudden and short build-up of immersion liquid without the risk of over spilling. For example, during moving of the substrate W or a closing disc up closer to the surface of the seal member 12 there will be a sudden decrease in the volume of the space 11 and therefore a rise in immersion liquid level. The ditch 222 can accommodate some of this excess liquid while it is extracted.

It should be appreciated that the array of holes 310 could be provided as a mesh or equivalent.

FIGS. 9*a-e* illustrate different configurations for the dike embodiment of the extractor. In FIG. 9*a*, the immersion liquid enters a volume 330 before being extracted by extractor 228. By contrast, in the design of FIG. 9*b*, it is arranged that the immersion liquid enters a narrow gap 340 before being extracted at outlet 228. Due to capillary forces, the gap 340 is completely filled with immersion liquid (if it is designed narrow enough) and if the under-pressure is matched with the size of the holes 224 the formation of bubbles in the extracted immersion liquid or the inclusion of bubbles in the extracted immersion liquid can be prevented thereby making the extraction flow a single phase flow and thereby preventing deleterious vibrations. In FIGS. 9*c* and 9*d*, different angles of the wall in which the array of holes 224 are formed are illustrated. In FIG. 9*e* a top plate 223 is added above the overflow area which enhances the extraction capacity due to the fact that the suction of the liquid is brought closer to the projection system PS, where the liquid meniscus tries to follow the projection system contour. The purpose of these diagrams is to illustrate that many configurations are possible which still have the aspects of the present invention.

FIGS. 10*a-e* illustrate various embodiments without the dike 220. Any angle of inclination of the wall in which the array of holes 224 are formed is possible and different configurations of paths for the immersion liquid to follow to the outlet 228 are illustrated. For example, in FIG. 10*b*, the gap 340 is similar to the gap in FIG. 9*b* such that single phase flow extraction is possible, in FIG. 10*e*, the top plate 223 is similar to that in FIG. 9*e*.

Another way to help minimize the risk of overflow of immersion liquid is illustrated in FIG. 11. The system illustrated in FIG. 11 matches the amount of incoming immersion liquid with the amount of removed immersion liquid by dynamically varying the rates of extraction and input. As can be seen, immersion liquid is supplied to the seal member 12 through inlet 128 and is removed through outlets 184, 228 and 328 as is described above in reference to FIG. 6. Having a controllable supply allows more flexibility in operating circumstances. For example, more variations in the leak flow rate through outlet 328 are allowable and even if the extraction system 224 does not have sufficient capacity to cope with the maximum flow, that does not necessarily lead to overflow because the supply of immersion liquid can be reduced to compensate. Even with a constant supply flow, a controllable extraction is desirable because different operating conditions, for example scanning in a different direction, can result in variable leak or extraction parameters which can be coped with by varying the extraction. Each extraction port includes a controllable valve 1228, 1184, 1328. The outlet ports 228, 128, 328 are all connected to a low pressure sources 2228, 2148, 2328 via a valve as illustrated. Extracted immersion liquid is lead to a reservoir 1500 which, if the immersion liquid is to be recycled, can be the source for the inlet 1248. The supply is controlled by a valve 1128 and an overflow path to the reservoir 1500 is provided with a valve 1148 controlling that.

The water level control mechanism allows the supply rate of immersion liquid to be varied as well as the extraction through the overflow 224, through the liquid extractor 180 and through the recess extractor 320. Each of the valves 1228, 1148, 1128, 1184, 1328 are variable valves though they may be valves which are either on or off. The amount of extraction can be varied either by varying the under pressure applied, using the valves controlling the under pressure or by varying the valves 1128, 1184, 1328 or by varying the bypass to ambient (also illustrated in FIG. 11).

There are three options to determine when a dynamic control action is needed. These are direct feedback in which the level of the immersion liquid is measured, indirect feedback in which the extraction flows from each of the extractors is measured or feed-forward in which a knowledge of the extraction flow and the operating circumstances is used to adjust the supply and/or extraction flows when circumstances change.

The water level may be measured in several ways, for example by a float in the reservoir 1500 or in the space 11, or by measuring the pressure of water at the bottom of the seal member 12. By determining the position of the water surface by reflection and detection of acoustical or optical signals on the upper surface of the immersion liquid. Further possibilities are by measuring the absorption or transmission of an acoustical, optical or electrical signal as a function of the amount of water or by measuring heat loss of a submerged wire in a known position in the space 11, the further the wire is submerged, the higher the heat loss.

In an embodiment, there is provided a lithographic apparatus, comprising: a substrate table constructed to hold a substrate; a projection system configured to project a patterned radiation beam onto a target portion of the substrate; a liquid supply system configured to supply liquid to a space between the projection system and the substrate table; and a control system configured to dynamically vary a rate of extraction of liquid by the liquid supply system from the space and/or dynamically vary a rate of supply of liquid by the liquid supply system such that a level of liquid in the space is maintained between a certain minimum and a certain maximum.

In an embodiment, the control system is configured to dynamically vary the rate or rates in response to a determination of a level of liquid in the space. In an embodiment, the lithographic apparatus further comprises a pressure sensor configured to measure a pressure of the liquid at a certain position in the space to determine the level of liquid in the space. In an embodiment, the lithographic apparatus further comprises an optical and/or acoustic source and a corresponding optical and/or acoustic detector configured to determine the level of liquid in the space by reflection and subsequent detection of an optical and/or acoustic signal off the top surface of the liquid. In an embodiment, the lithographic apparatus further comprises an acoustical/optical/electrical signal generator configured to generate an acoustical/optical/electrical signal in liquid in the space and a detector configured to detect the acoustical/optical/electrical signal to determine the level of liquid in the space. In an embodiment, the lithographic apparatus further comprises a wire configured to be submerged in the liquid at a certain location in the space and a detector configured to measure a temperature of the wire to determine the level of liquid in the space. In an embodiment, the lithographic apparatus further comprises a float configured to float on the top surface of the liquid in the space and a sensor configured to measure a position of the float to determine the level of liquid in the space. In an embodiment, the control system is configured to actively vary the rate or rates based on a measurement of an amount of liquid extracted from the space by the liquid supply system. In an embodiment, the control system is configured to dynamically vary the rate or rates in a feed forward manner based on operating circumstances of the apparatus. In an embodiment, the lithographic apparatus further comprises valves configured to control the rate of extraction and/or supply. In an embodiment, the lithographic apparatus further comprises valves configured to control an under pressure applied to a liquid extractor of the liquid supply system.

In an embodiment, there is provided a device manufacturing method, comprising: projecting a patterned beam of radiation onto a substrate using a projection system of a lithographic apparatus, wherein liquid is provided to a space between the projection system and the substrate and a rate of extraction of liquid from the space is dynamically varied and/or the rate of supply of liquid to the space is dynamically varied to maintain a level of liquid in the space between a certain minimum and a certain maximum.

In an embodiment, there is provided a lithographic apparatus, comprising: a substrate table constructed to hold a substrate; a projection system configured to project a patterned radiation beam onto a target portion of the substrate; and a barrier member having a surface surrounding a space between the projection system and the substrate table, the barrier member being configured to at least partly confine a liquid in the space, the barrier member comprising a liquid inlet configured to provide liquid to the space and a liquid outlet configured to remove liquid from the space, wherein the liquid inlet and/or the liquid outlet extends around a fraction of the inner periphery of the surface.

In an embodiment, the fraction is less than about ½. In an embodiment, the fraction is less than about ⅓. In an embodiment, the fraction is more than about ¹⁄₂₀. In an embodiment, the fraction is more than about ¹⁄₁₅. In an embodiment, the liquid inlet and the liquid outlet are positioned on the surface such that they face one another across the space. In an embodiment, the liquid inlet and liquid outlet are positioned along different parts of the surface around the inner periphery. In an embodiment, the liquid outlet is arranged to provide a variable liquid extraction rate along its length in the direction following the inner periphery. In an embodiment, a maximum extraction rate is provided substantially opposite the liquid inlet. In an embodiment, the liquid outlet extends substantially around the inner periphery. In an embodiment, the liquid inlet and the liquid outlet extend around a fraction of the inner periphery of the surface, the fraction of the inner periphery for the liquid inlet being smaller than the fraction of the inner periphery for the liquid outlet. In an embodiment, the liquid outlet is positioned radially outwardly, relative to the optical axis of the projection system, of the liquid inlet. In an embodiment, the lithographic apparatus comprises at least three liquid outlets, one liquid outlet facing the liquid inlet across the space and one liquid outlet on each side of the liquid inlet.

In an embodiment, there is provided a device manufacturing method, comprising: projecting a patterned beam of radiation onto a substrate using a projection system, wherein a barrier member has a surface which surrounds a space between the projection system and the substrate, the barrier member configured to at least partly contain a liquid in the space; providing liquid to the space through a liquid inlet; and removing liquid from the space via a liquid outlet, wherein the liquid inlet and/or the liquid outlet extends around a fraction of the inner periphery of the surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

The invention claimed is:

1. A liquid confinement apparatus for an immersion lithographic system comprising a substrate table constructed to hold a substrate and a projection system configured to project a patterned radiation beam onto a target portion of the substrate, the liquid confinement apparatus comprising:
   a barrier member having a surface arranged to surround a space between the projection system and the substrate table, the barrier member being configured to at least partly confine a liquid in the space and the barrier member comprising:
      a liquid inlet configured to provide liquid to the space,
      a liquid outlet configured to remove liquid from the space, wherein the liquid outlet comprises a porous member located in a surface configured to face the substrate,
      a first gas inlet configured to provide gas to the space, the first gas inlet arranged to face toward the substrate and the first gas inlet located outward, relative to a central portion of the barrier member, of the porous member, and
      a second gas inlet configured to provide gas to the space, the second gas inlet arranged to face toward the substrate and the second gas inlet located outward, relative to the central portion of the barrier member, of the first gas inlet.

2. The apparatus of claim 1, wherein the porous member of the liquid outlet is positioned outwardly, relative to the central portion of the barrier member, of the liquid inlet.

3. A liquid confinement apparatus for an immersion lithographic system comprising a substrate table constructed to hold a substrate and a projection system configured to project a patterned radiation beam onto a target portion of the substrate, the liquid confinement apparatus comprising:
   a liquid inlet configured to provide liquid to a space between a final element of the projection system and a substrate,
   an extractor configured to remove liquid from the space, the extractor comprising a two dimensional array of orifices, extending at least partly in a horizontal direction and arranged to face toward the substrate, through which the liquid can be extracted from the space,
   a first gas inlet configured to provide gas to the space, the first gas inlet arranged to face toward substrate and the first gas inlet located outward, relative to a central portion of the liquid confinement apparatus, of the porous member, and
   a second gas inlet configured to provide gas to the space, the second gas inlet arranged to face toward the substrate and the second gas inlet located outward, relative to the central portion of the liquid confinement apparatus, of the first gas inlet.

4. The apparatus of claim 3, wherein the array of orifices of the extractor are arranged to extend at least partly around the outer periphery of the space.

5. The apparatus of claim 3, comprising a barrier member providing a surface to surround the space and configured to contain the liquid, the extractor formed in the surface.

6. The apparatus of claim 3, wherein the array of orifices of the extractor is positioned outwardly, relative to the central portion of the liquid confinement apparatus, of the liquid inlet.

7. The apparatus of claim 3, further comprising a port configured to exhaust fluid, the port located outward, relative to the central portion of the liquid confinement apparatus, of the first gas inlet and located inward, relative to the central portion of the liquid confinement apparatus, of the second gas inlet.

8. The apparatus of claim 3, wherein the first gas inlet comprises an opening defined in a surface within a groove, the opening arranged so as to be away from an exit of the groove.

9. The apparatus of claim 3, wherein the second gas inlet has an opening to supply gas to the space at a position arranged to be closer to the substrate than an opening of the first gas inlet to supply gas to the space.

10. The apparatus of claim 1, wherein the first gas inlet comprises an opening defined in a surface within a groove, the opening arranged so as to be away from an exit of the groove.

11. The apparatus of claim 1, wherein the second gas inlet has an opening to supply gas to the space at a position arranged to be closer to the substrate than an opening of the first gas inlet to supply gas to the space.

12. The apparatus of claim 1, further comprising a port configured to exhaust fluid, the port located outward, relative to the central portion of the barrier member, of the first gas inlet and located inward, relative to the central portion of the barrier member, of the second gas inlet.

13. The apparatus of claim 1, wherein there is no other opening configured to provide a fluid or exhaust a fluid located between the porous member and the first gas inlet, between the first gas inlet and the port and between the port and the second gas inlet.

14. The apparatus of claim 1, wherein the porous member is the form of a continuous ring around the central portion of the barrier member.

15. A liquid confinement apparatus for an immersion lithographic system comprising a substrate table constructed to hold a substrate and a projection system configured to project a patterned radiation beam onto a target portion of the substrate, the liquid confinement apparatus comprising:
   a barrier member configured to at least partly confine a liquid in a space between the projection system and the substrate table and the barrier member comprising:
      a liquid outlet configured to remove liquid from the space,
      a first gas inlet configured to provide gas to the space, the first gas inlet arranged to face toward the substrate and the first gas inlet located outward, relative to a central portion of the barrier member, of an opening of the liquid outlet, and
      a second gas inlet configured to provide gas to the space, the second gas inlet arranged to face toward the substrate and the second gas inlet located outward, relative to the central portion of the barrier member, of the first gas inlet, wherein the second gas inlet has an opening to supply gas to the space at a position arranged to be closer to the substrate than an opening of the first gas inlet to supply gas to the space.

16. The apparatus of claim 15, further comprising a liquid inlet configured to provide liquid to the space and an opening of the liquid outlet is positioned outwardly, relative to the central portion of the barrier member, of the liquid inlet.

17. The apparatus of claim 15, wherein the opening of the liquid outlet comprises a porous member located in a surface configured to face toward the substrate.

18. The apparatus of claim 15, further comprising a port configured to exhaust fluid, the port located outward, relative to the central portion of the barrier member, of the first gas inlet and located inward, relative to the central portion of the barrier member, of the second gas inlet.

19. The apparatus of claim 15, wherein the first gas inlet comprises an opening defined in a surface within a groove, the opening arranged so as to be away from an exit of the groove.

20. The apparatus of claim 15, wherein the barrier member has a surface arranged to surround the space between the projection system and the substrate table.

\* \* \* \* \*

UNITED STATES PATENT AND TRADEMARK OFFICE
CERTIFICATE OF CORRECTION

PATENT NO. : 10,495,984 B2
APPLICATION NO. : 16/276861
DATED : December 3, 2019
INVENTOR(S) : Marcel Beckers et al.

Page 1 of 1

It is certified that error appears in the above-identified patent and that said Letters Patent is hereby corrected as shown below:

In the Claims

In Column 15, Line 62, Claim 3:
Please correct "porous member" to read -- two dimensional array of orifices --

Signed and Sealed this
Fourteenth Day of July, 2020

Andrei Iancu
*Director of the United States Patent and Trademark Office*